United States Patent [19]
Kao et al.

[11] Patent Number: 5,683,941
[45] Date of Patent: Nov. 4, 1997

[54] SELF-ALIGNED POLYCIDE PROCESS THAT UTILIZES A PLANARIZED LAYER OF MATERIAL TO EXPOSE POLYSILICON STRUCTURES TO A SUBSEQUENTLY DEPOSITED METAL LAYER THAT IS REACTED TO FORM THE METAL SILICIDE

[75] Inventors: Dah-Bin Kao; John Pierce, both of Palo Alto, Calif.

[73] Assignee: National Semiconductor Corporation, Santa Clara, Calif.

[21] Appl. No.: 678,417

[22] Filed: Jul. 2, 1996

[51] Int. Cl.⁶ ................................................. H01L 21/44
[52] U.S. Cl. .......................... 437/200; 437/192; 437/193; 437/195
[58] Field of Search ............................. 437/192, 193, 437/195, 200, 228

[56] References Cited

U.S. PATENT DOCUMENTS

| | | | |
|---|---|---|---|
| 4,774,201 | 9/1988 | Woo et al. | 437/193 |
| 4,957,881 | 9/1990 | Crotti | 437/195 |
| 5,177,028 | 1/1993 | Manning | 437/67 |
| 5,268,330 | 12/1993 | Givens et al. | 437/200 |
| 5,610,083 | 3/1997 | Chan et al. | 437/60 |

Primary Examiner—John Niebling
Assistant Examiner—Kevin F. Turner
Attorney, Agent, or Firm—Limbach & Limbach L.L.P.

[57] ABSTRACT

The process for forming a layer of metal silicide over polysilicon structures, such as gates and interconnect lines, is simplified by forming a layer of insulation material over the polysilicon structures, removing the layer of insulation material until the layer of insulation material is substantially planar and the thickness of the insulation material over the polysilicon structures is within a predetermined thickness range, etching the planarized layer of insulation material until portions of the polysilicon structures are exposed, depositing a layer of metal over the resulting structure, and then reacting the metal layer with the polysilicon structures to form the layer of metal silicide.

71 Claims, 16 Drawing Sheets

SELF-ALIGNED POLYCIDE PROCESS THAT UTILIZES A PLANARIZED LAYER OF MATERIAL TO EXPOSE POLYSILICON STRUCTURES TO A SUBSEQUENTLY DEPOSITED METAL LAYER THAT IS REACTED TO FORM THE METAL SILICIDE

BACKGROUND OF THE INVENTION

1. Field of the Invention.

The present invention relates to a polycide process and, more particularly, to a self-aligned polycide process that utilizes a planarized layer of material to expose polysilicon structures to a subsequently deposited metal layer that is reacted to form the metal silicide.

2. Description of the Related Art.

With the increased density of semiconductor devices, the sheet resistivity of the electrically-conducting structures of these devices, such as the gates of MOS transistors, the emitters of bipolar transistors, the local interconnect regions of MOS and bipolar transistors, and the interconnect lines that connect these devices together, is beginning to limit the speed at which these devices can operate.

One well-known technique for reducing the sheet resistivity of the polysilicon gates and interconnect lines of a conventional buried-channel CMOS device is to form a layer of metal silicide over the polysilicon gates and interconnect lines. The resulting gate and interconnect structures, known as polycide structures, provide the lower resistivity of a metal silicide along with the well-known attributes of polysilicon.

FIGS. 1A–1B show cross-sectional drawings that illustrate a standard polycide process as part of an overall buried-channel CMOS process. As shown in FIG. 1A, the process begins with the conventional formation of a well region 12 in a lightly-doped substrate 10 of an opposite conductivity type, a series of field oxide regions FOX, regions of gate oxide 14, and a layer of polysilicon (poly) 16 (along with channel-stop and threshold implants).

Following the conventional n+ doping of the poly layer 16, the polycide process begins with the deposition of an overlying layer of tungsten silicide (WSi$_2$) 18. After this, a gate/line mask 20 is formed and patterned over the layer of tungsten silicide 18 using standard photolithographic techniques.

Once mask 20 has been formed, as shown in FIG. 1B, the unmasked regions of silicide 18 and the underlying regions of poly 16 are then etched to form polysilicon gates 22 and interconnect lines 24. Thus, with conventional CMOS devices, polycide structures can be formed by simply depositing a layer of tungsten silicide over the layer of doped polysilicon.

One drawback to conventional buried-channel CMOS devices, whether formed as polycide structures or not, is that the poly gates of both the NMOS and PMOS transistors are heavily doped with the same n-type material. Although ideal for an NMOS transistor, an n-type gate makes it difficult to obtain a low threshold voltage in a PMOS transistor.

Thus, to optimize the performance of the PMOS transistors, more recent devices are formed as so-called "surface-channel" CMOS devices. With surface-channel CMOS devices, the polysilicon gates of the NMOS transistors are doped with an n-type material while the polysilicon gates of the PMOS transistors are doped with a p-type material.

However, with surface-channel CMOS devices, when the n-type gate of an NMOS transistor is connected to the p-type gate of a PMOS transistor by either an n-type or p-type interconnect line, a p-n junction is formed at the point where the n-type or p-type interconnect line meets the p-type or n-type gate, respectively.

Thus, to avoid this p-n junction, as well as to reduce the sheet resistance of the polysilicon gates and interconnect lines, surface-channel CMOS devices require the use of a polycide or equivalent structure to provide an electrical connection between NMOS and PMOS devices.

One process for forming surface-channel CMOS devices with polycide structures is simply to dope the poly layer in the NMOS region with an n-type material, and the poly layer in the PMOS region with a p-type material. With this approach, polycide structures can then be formed by simply depositing a layer of tungsten silicide over the layer of n-type and p-type doped polysilicon.

FIGS. 2A–2C show cross-sectional drawings that illustrate a polycide process as part of an overall surface-channel CMOS process. As shown in FIG. 2A, this process also begins with the conventional formation of a well region 32 in a lightly-doped substrate 30 of an opposite conductivity type, a series of field oxide regions FOX, regions of gate oxide 34, and a layer of polysilicon (poly) 36.

Following the conventional formation of poly layer 36, an n-implant mask 38 is formed over the PMOS regions to protect poly layer 36 in the PMOS regions from the n+ doping of poly layer 36 in the NMOS regions. Following this, the unmasked regions are doped with an n-type material.

After poly layer 36 in the NMOS regions has been doped with an n-type material, the n-implant mask 38 is removed and the process is repeated with a p-implant mask (not shown) that protects poly layer 36 in the NMOS regions from the p+ doping of poly layer 36 in the PMOS regions.

Next, as shown in FIG. 2B, a layer of tungsten silicide (WSi$_2$) 40 is deposited over poly layer 36, followed by the formation and patterning of a gate/line mask 42. After this, as shown in FIG. 2C, the unmasked regions of tungsten silicide 40 and the underlying regions of poly 36 are etched to form the polysilicon gates and interconnect lines of the device.

Thus, as with conventional buried-channel CMOS devices, surface-channel polycide structures can also be formed by simply depositing a layer of tungsten silicide over the layer of doped polysilicon. However, unlike buried-channel CMOS devices, the above-described process for forming surface-channel CMOS devices requires an additional two masking steps over a conventional buried-channel CMOS process to dope poly layer 36.

Another drawback to the above-described surface-channel process is that high-temperature processing steps are typically used after the formation of the metal silicide layer. These high-temperature excursions, in turn, can lead to dopant interdiffusion between the n+ poly and the p+ poly via the metal silicide such that one type of poly can be counter doped by the other type of poly, i.e., p-type ions moving from the p+ poly to the n+ poly.

Thus, due to the added cost and complexity of using two additional masking steps along with the high-temperature limitations, this process is not a preferred approach to forming surface-channel CMOS devices.

In addition, one drawback to using a deposited metal silicide to form the polycide structures, whether with buried-channel or surface-channel CMOS devices, is that deposited metal silicide suffers from a tendency to delaminate, i.e., a tendency to peel away from the underlying poly layer. This delamination is believed to occur as a result of stress placed on the polycide structures, and the failure to remove all residual oxide from the surface of the polysilicon during the cleaning step prior to the deposition of the metal silicide layer.

Another approach which is commonly used to form silicide over the gates and interconnect lines, as well as the source and drain regions, is a process known as self-aligned silicide, or salicide. With the salicide process, the silicide is formed after the formation of the source and drain regions. As a result, the same implant step can be used to dope the polysilicon gates as is used to form the source and drain regions.

FIGS. 3A–3E show cross-sectional drawings that illustrate a conventional salicide process as part of an overall surface-channel CMOS process. As shown in FIG. 3A, the process begins with the conventional formation of a well region 52 in a lightly-doped substrate 50 of an opposite conductivity type, a series of field oxide regions FOX, regions of gate oxide 54, and a layer of polysilicon (poly) 56.

Following the conventional formation of poly layer 56, a gate/line mask 58 is formed and patterned over the layer of polysilicon 56. Next, the unmasked regions of poly 56 are etched to form polysilicon gates 60 and interconnect lines 62 for the NMOS devices, and polysilicon gates 64 and interconnect lines 66 for the PMOS devices.

Following this, as shown in FIG. 3B, mask 58 is removed and an n-implant mask 68 is formed over the PMOS regions to protect the PMOS regions. Once mask 68 is in place, the NMOS regions are implanted with an n-type material to lightly dope the polysilicon gates 62 and interconnect lines 64, and to form the n-type source and drain regions 70 and 72. (A layer of sacrificial oxide is typically formed over the exposed regions of substrate 50 prior to the implant).

Following this, the n-implant mask 68 is removed and the process is repeated with a p-implant mask (not shown) that protects the NMOS regions during the p-type doping of the poly gates 66 and interconnect lines 68, and the formation of the p-type source and drain regions 74 and 76.

Next, as shown in FIG. 3C, a layer of oxide is formed over the device, and then anisotropically etched to form oxide spacers 78 along the sidewalls of the polysilicon gates 62/66 and interconnect lines 64/68. Following this, a second n-implant mask 79 is formed to protect the PMOS regions. Once mask 79 is in place, the NMOS regions are again implanted with an n-type material to heavily dope the polysilicon gates 62, interconnect lines 64, and the source and drain regions 70 and 72. This step forms the well-known LDD structures.

Next, the n-implant mask 79 is removed and the process is repeated with a p-implant mask (not shown) that protects the NMOS regions during the heavy p+ doping of the poly gates 66, interconnect lines 68, and the source and drain regions 74 and 76.

Following this, as shown in FIG. 3D, a layer of refractory metal 80 is formed over the device. Next, as shown in FIG. 3E, the layer of refractory metal 80 is reacted to form a layer of metal silicide 82 over the polysilicon gates 62/66, interconnect lines 64/68, source regions 70/74, and drain regions 72/76. The layer of metal 80 does not significantly react with the oxide spacers 78 or field oxide regions FOX.

After the layer of metal silicide 82 has been formed, the unreacted metal layer 80 is removed with a selective etch. The salicide process is self aligned in that no masking steps are required to form the layer of metal silicide over gates 62/66, interconnect lines 64/68, source regions 70/74, and drain regions 72/76.

One limitation of the conventional salicide process, however, is that although the metal layer does not significantly react with the oxide spacers, faint traces of silicide can remain on the oxide spacers after the selective etch. These traces, in turn, can produce a condition known as "bridging" where the traces of silicide short the gate to the source or drain regions.

In addition, as shown in FIGS. 3D and 3E, since the metal silicide is formed by reacting a layer of metal with the underlying silicon, the salicide process consumes a portion of the silicon during the reaction. As a result, the salicide process results in even shallower junction depths (CMOS devices typically utilize shallow junction depths) which, in turn, can lead to junction leakage.

Another limitation of the conventional salicide process is that as the width of the silicided interconnect lines drops below approximately 0.25 microns, the sheet resistivity of the silicided polysilicon lines increases. This increase in sheet resistivity is believed to be caused by various mechanisms such as distorted silicide shapes (the so-called "smiling" silicide structure), thinning silicides, smaller grain sizes, and an incomplete phase transformation.

Thus, as a result of the above, there is a need for a method for forming a layer of metal silicide over the polysilicon gates and interconnect lines of a conventional surface-channel CMOS device that reduces or eliminates the above-noted limitations.

SUMMARY OF THE INVENTION

The present invention provides a self-aligned method for forming a layer of metal silicide over a structure that is formed as part of a semiconductor device, such as a surface-channel CMOS device, that reduces or eliminates the limitations present in conventional polycide and salicide fabrication processes.

In the present invention, the method begins by forming a layer of insulation material over the semiconductor device so that the structure is covered by the layer of insulation material. Next, the layer of insulation material is removed until the layer of insulation material is substantially planar, and a surface of the structure is exposed. Following this, a layer of metal is deposited over the layer of insulation material and the exposed surface of the structure. Following this, the layer of metal is reacted with the structure to form a layer of metal silicide over the structure, and a layer of unreacted metal over the layer of insulation material. The layer of unreacted metal is then removed from the layer of insulation material, and the process continues with conventional back-end processing steps.

A better understanding of the features and advantages of the present invention will be obtained by reference to the following detailed description and accompanying drawings which set forth an illustrative embodiment in which the principles of the invention are utilized.

DETAILED DESCRIPTION

Figure 4A:
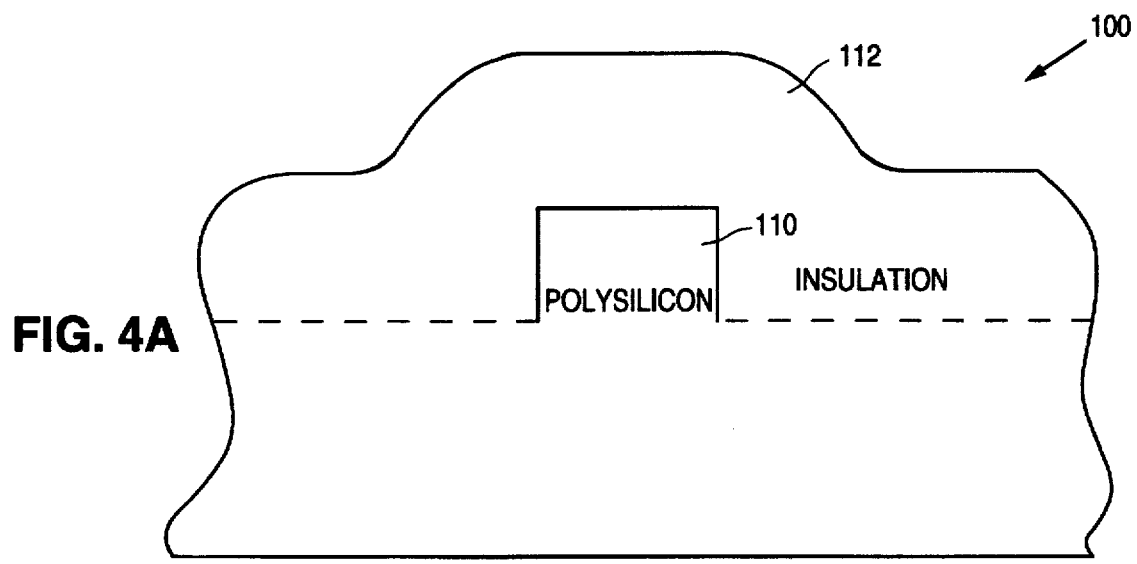
FIGS. 4A–4C are cross-sectional drawings illustrating a self-aligned polycide process in accordance with the present invention.
Figure 4B:
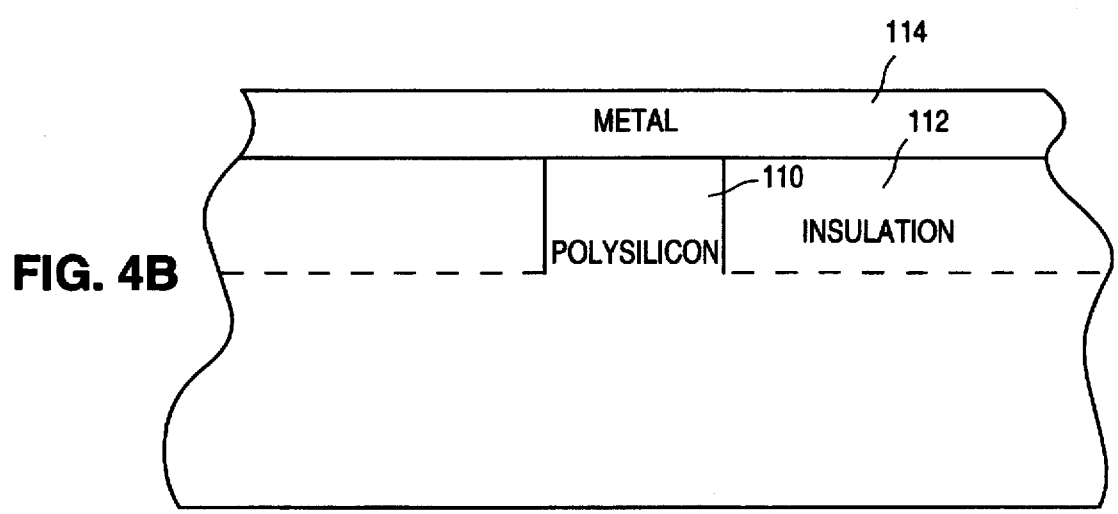
Figure 4C:
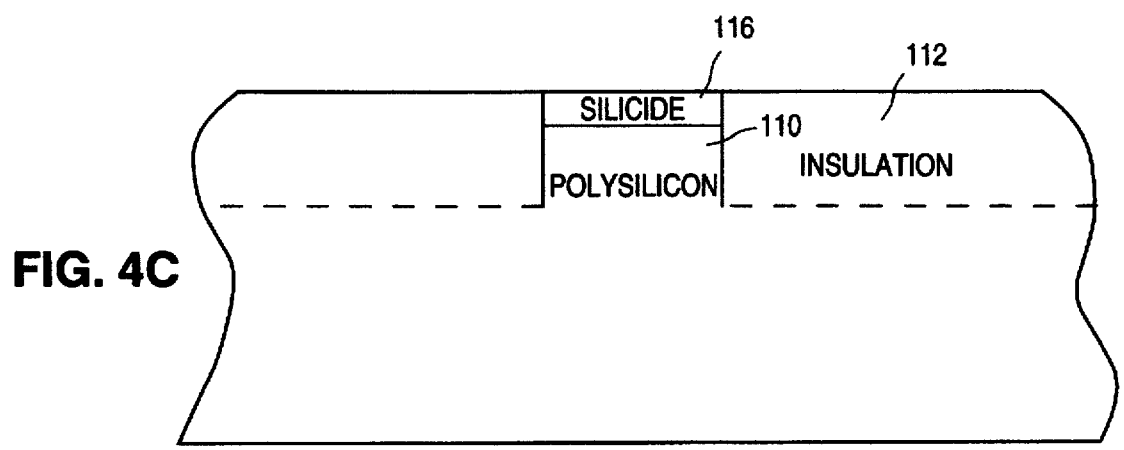

FIGS. 4A–4C show cross-sectional drawings that illustrate a self-aligned polycide process in accordance with the present invention. As shown in FIG. 4A, the process of the present invention begins with the conventional formation of a semiconductor device 100 that includes an electrically-conductive polysilicon structure 110. Structure 110 can represent, for example, the gate of a MOS transistor, the emitter of a bipolar transistor, the local interconnect material of a MOS or bipolar transistor (e.g., the material formed over a doped region, such as a source region, to facilitate contact between the doped region and a contact plug), or the interconnect line between semiconductor devices.

Once device 100 and structure 110 have been formed, the process of the present invention begins with the deposition of a layer of insulation material 112, such as oxide, nitride, or an oxide/nitride composite, over device 100 such that structure 110 is covered by the layer of insulation material 112.

Following this, as shown in FIG. 4B, the layer of insulation material 112 is removed by chemical-mechanical polishing (CMP) or other equivalent techniques, such as reflow or resist etch back, until the layer of insulation material 112 is substantially planar, and the top surface of structure 110 is exposed. (If the low point of the layer of insulation material 112 is lower than the top surface of structure 110, a portion of the top surface of structure 110 may need to be removed to obtain a substantially planar surface).

Next, a layer of metal 114, such as titanium, cobalt, tungsten, or nickel, is deposited over the layer of insulation material 112, and the exposed top surface of structure 110. After this, as shown in FIG. 4C, the layer of metal 114 is reacted with the exposed polysilicon in a nitrogen ambient to form a layer of metal silicide 116 by utilizing a rapid thermal process (RTP).

At this point, the layer of metal silicide 116 is in the so-called C49 phase. The layer of metal 114 formed over the layer of insulation material 112, however, does not significantly react with the layer of insulation material 112 (although a thin layer of metal nitride is formed over the layer of metal 114 due to the nitrogen ambient). After the layer of metal silicide 116 has been formed, the unreacted metal layer 114 (which includes the thin layer of metal nitride) is removed with a selective etch utilizing an etch chemistry such as $NH_4OH+H_2O_2+H_2O$ at a ratio of 1:1:5.

Next, the layer of metal silicide 116 is further crystallized by exposing device 100 to a second RTP step. At this point, the layer of metal silicide 116 is in the so-called C54 or low-resistivity phase. Following this, the process continues with conventional back-end processing steps.

Figure 5A:
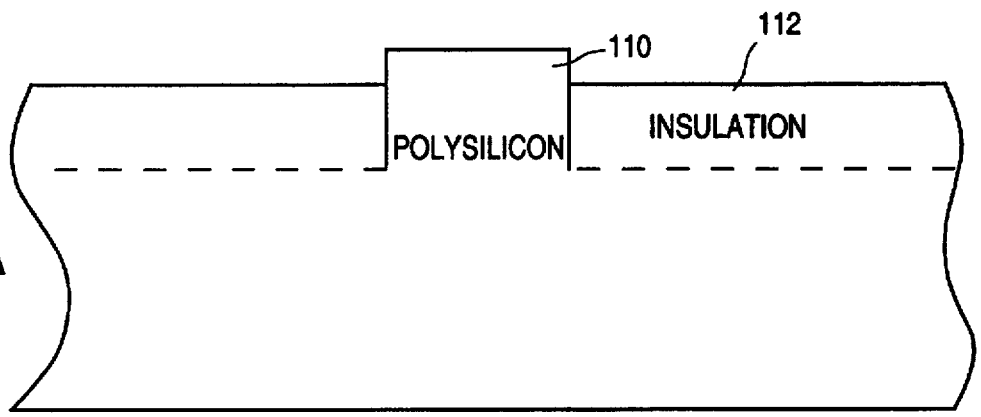
FIGS. 5A–5C are cross-sectional drawings illustrating a first alternative process in accordance with the present invention.
Figure 5B:
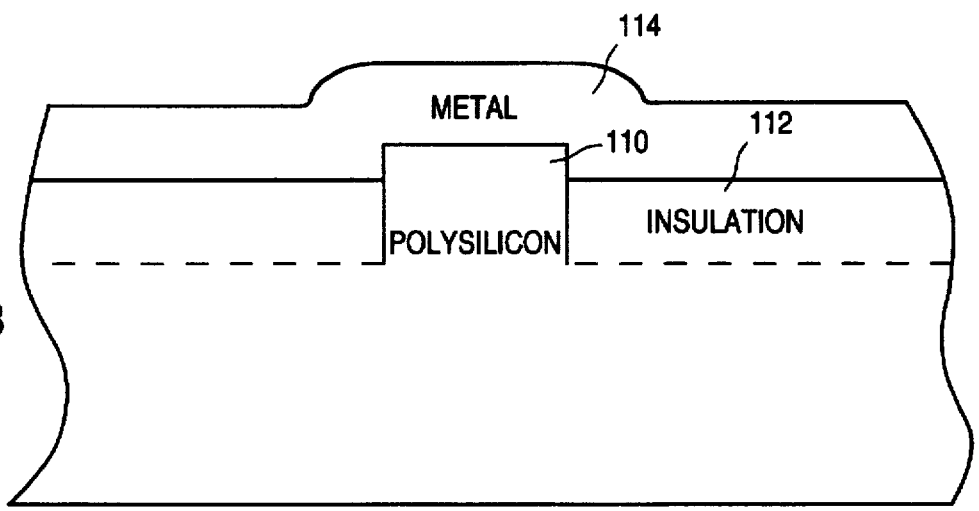
Figure 5C:
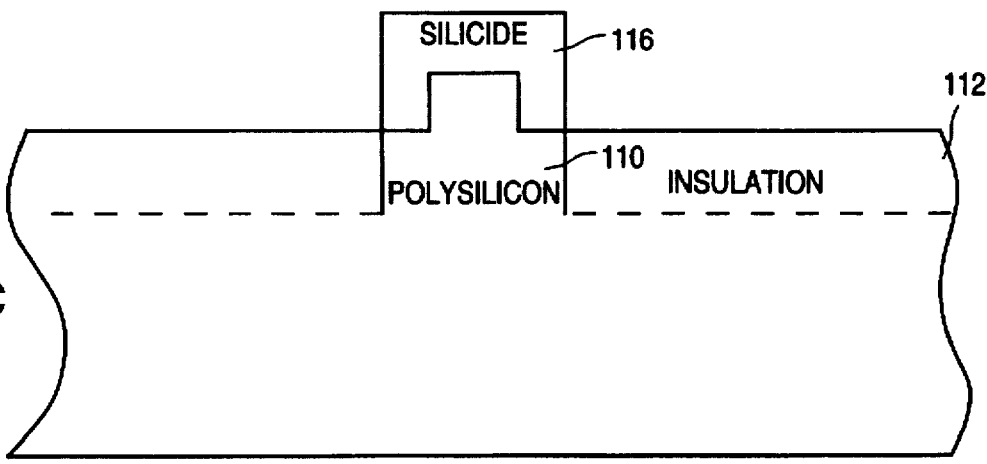

FIGS. 5A–5C show cross-sectional drawings that illustrate a first alternative process in accordance with the present invention. As shown in FIG. 5A, the layer of insulation material 112 can be etched following the planarization step so that a portion of the sidewalls of structure 100 can also be exposed.

Once a portion of the sidewalls of structure 100 have been exposed, as shown in FIG. 5B, the layer of metal 114 is deposited over the layer of insulation material 112, and the exposed top and sidewall surfaces of structure 110. After this, the process continues as above to produce the device shown in FIG. 5C.

In a second alternative process of the present invention, rather than removing the layer of insulation material 112 until the layer of insulation material 112 is substantially planar, and the top surface of structure 110 is exposed, the removing step can be terminated when the thickness of the layer of insulation material over structure 110 is within a predetermined thickness range, and the layer of insulation material 112 is substantially planar.

Following this, the layer of insulation material is etched until a surface of structure 110 is exposed. After this, the process continues as described above with the deposition of the layer of metal 114.

In a third alternative process of the present invention, rather than planarizing and etching the layer of insulation material 112 to expose structure 110, the layer of insulation material 112 can be masked and etched to expose structure 110. Following this, the layer of metal 114 is deposited and then reacted to form the layer of metal silicide 116. As above, the unreacted metal can then be removed with a selective etch. This process, however, is not self aligned and requires an additional masking step.

In a fourth alternative process of the present invention, rather than depositing the layer of metal 114 over the layer of insulation material 112, and the exposed surfaces of structure 110, a layer of tungsten can be selectively deposited by chemical vapor deposition (CVD). With a CVD process, the layer of tungsten is only formed over the exposed surfaces of structure 110. Following the chemical vapor deposition of metal layer 114, the process continues with conventional back-end processing steps.

One method that particularly benefits from the process of the present invention is the method for forming surface-channel CMOS devices. FIGS. 6A–6E show cross-sectional drawings that illustrate the present invention as applied to a method for forming surface-channel CMOS devices.

Figure 6A:
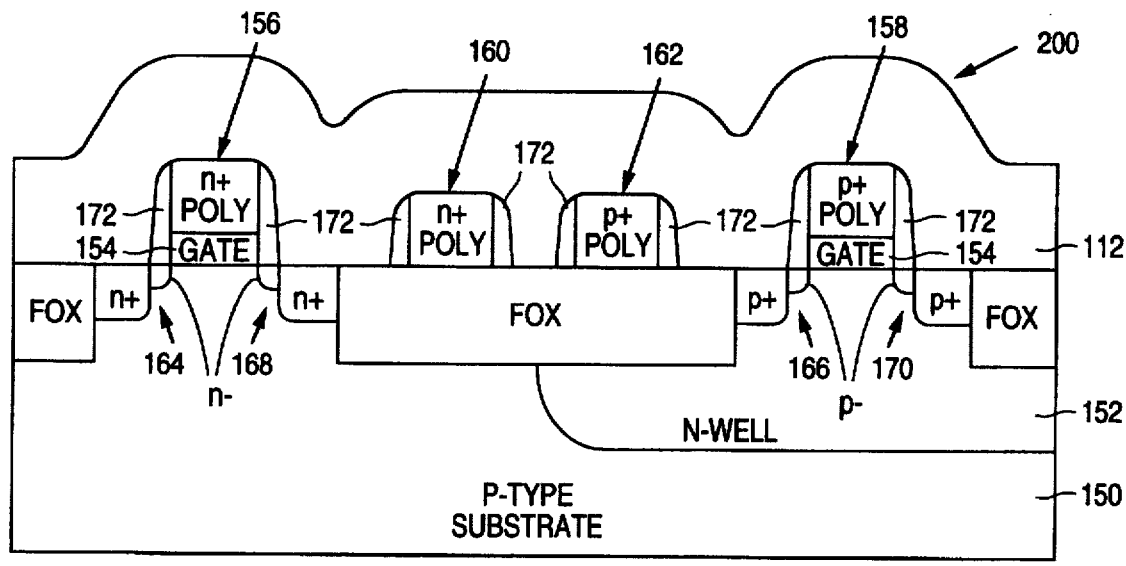
FIGS. 6A–6E are cross-sectional drawings illustrating the self-aligned polycide process of the present invention as applied to a surface-channel CMOS process.

As shown in FIG. 6A, the surface-channel process begins with the conventional formation of a surface-channel CMOS structure 200 that includes an n-well region 152 formed in a lightly-doped p-type substrate 150, trenched field oxide regions FOX, a series of gate oxide regions 154, n+ and p+ polysilicon gates 156/158, n+ and p+ polysilicon interconnect lines 160/162, n+/n– and p+/p– source regions 164/166, n+/n− and p+/p− drain regions 168/170, and oxide spacers 172 (along with channel-stop and threshold implants).

Once CMOS structure 200 has been formed, the layer of insulation material 112 (oxide, nitride, or oxide/nitride composite) is deposited over gates 156/158, interconnect lines 160/162, spacers 172, the exposed regions of substrate 150, and the field oxide regions FOX.

Figure 6B:
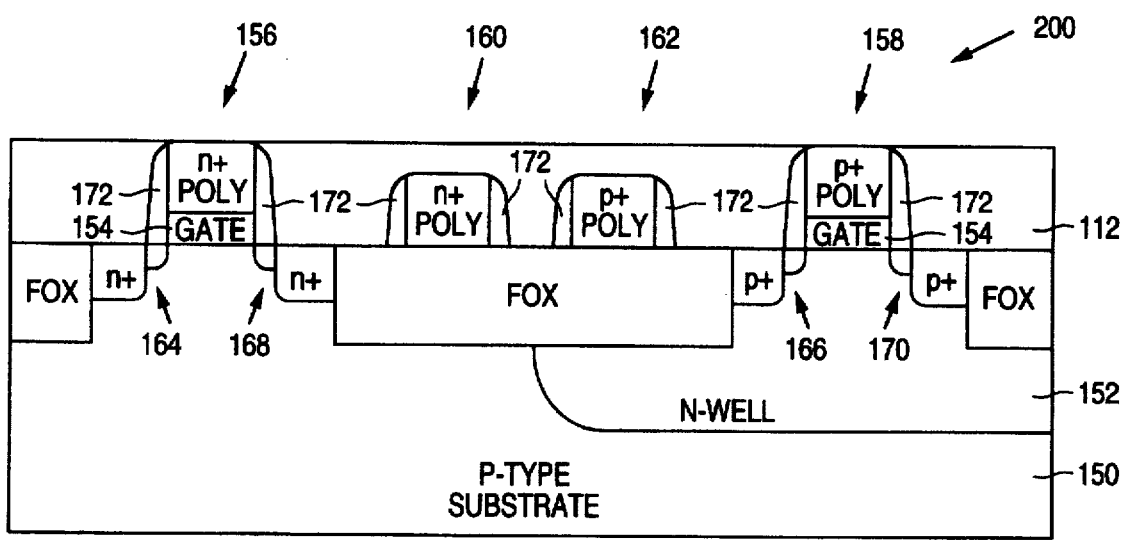

Following this, as shown in FIG. 6B, the layer of insulation material 112 is removed (by CMP or other equivalent techniques) until the layer of insulation material 112 is substantially planar, and the top surfaces of the polysilicon gates 156/158 are exposed. (When the top surfaces of the polysilicon gates 156/158 are exposed, a thin layer of insulation material 112 approximately 50–80 Å thick remains on the top surface of the interconnect lines 160/162 since the field oxide regions FOX only grow upward a small amount during the formation of the gate oxide regions 154).

Figure 6C:
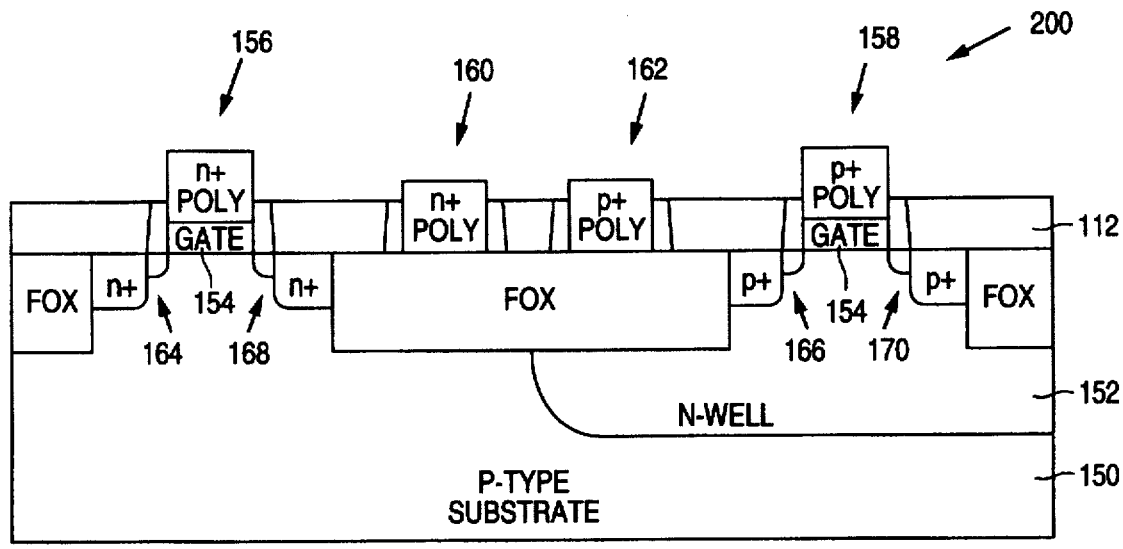

Next, as shown in FIG. 6C, the layer of insulation material 112 and the oxide spacers 172 are selectively etched to expose both the top surfaces and a portion of the sidewall surfaces of the gates 156/158 and interconnect lines 160/162.

Figure 6D:
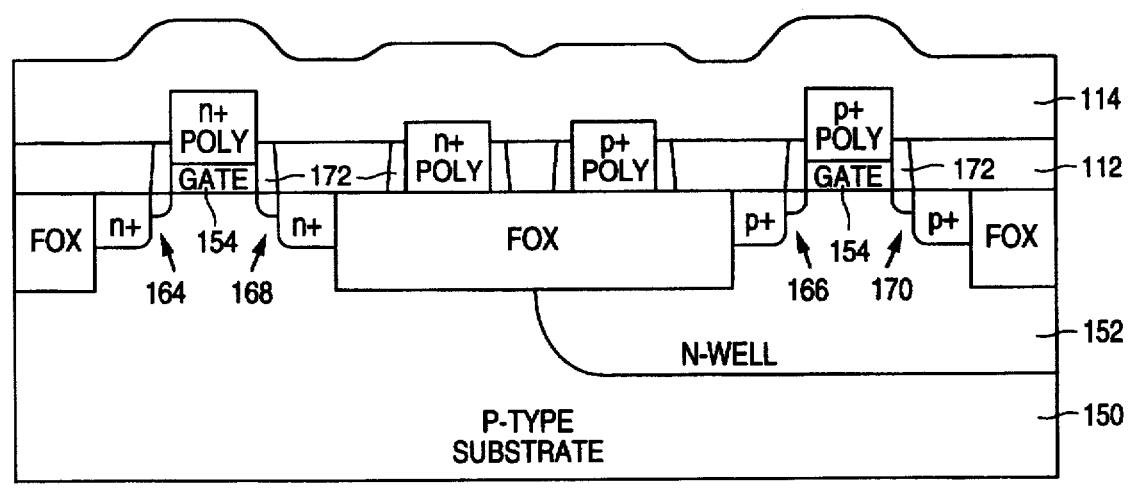

As shown in FIG. 6D, once the polysilicon gates 156/158 and interconnect lines 160/162 have been exposed, the surface-channel process continues with the deposition of a metal layer 114 (such as titanium, cobalt, tungsten, or nickel) approximately 200–1,000 Å thick over the layer of insulation material 112, and the exposed top and sidewall surfaces of the gates 156/158 and interconnect lines 160/162. (The thickness of the layer of metal 114 can be greater in the present invention than is used with a conventional salicide process because the source and drain regions are not silicided).

Figure 6E:
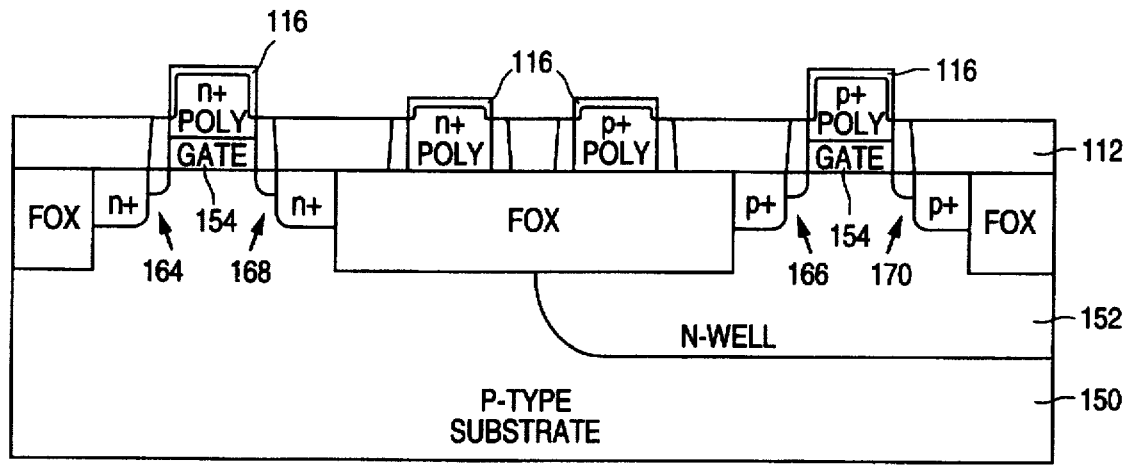

Following this, as shown in FIG. 6E, the layer of metal 114 is reacted with the exposed polysilicon in a nitrogen ambient to form metal silicide layer 116 by utilizing a rapid thermal process (RTP) of approximately 650°–750° C. for 30 to 60 seconds. (As above, the layer of metal silicide 116 is in the so-called C49 phase at this point). The layer of metal 114, however, does not significantly react with the oxide spacers 172 or the layer of insulation material 112 (although a thin layer of metal nitride is formed over the layer of metal 114 due to the nitrogen ambient). After the layer of metal silicide 116 has been formed, the unreacted metal layer 114 (which includes the thin layer of metal nitride) is removed with a selective etch utilizing an etch chemistry such as $NH_4OH+H_2O_2+H_2O$ at a ratio of 1:1:5.

Next, the layer of metal silicide 116 is further crystallized by exposing the structure to a second RTP step of approximately 800°–850° C. for 10 to 60 seconds. (As above, the layer of metal silicide is in the so-called C54 or low-resistivity phase at this point). Following this, the process continues with conventional back-end processing steps.

Figure 7:
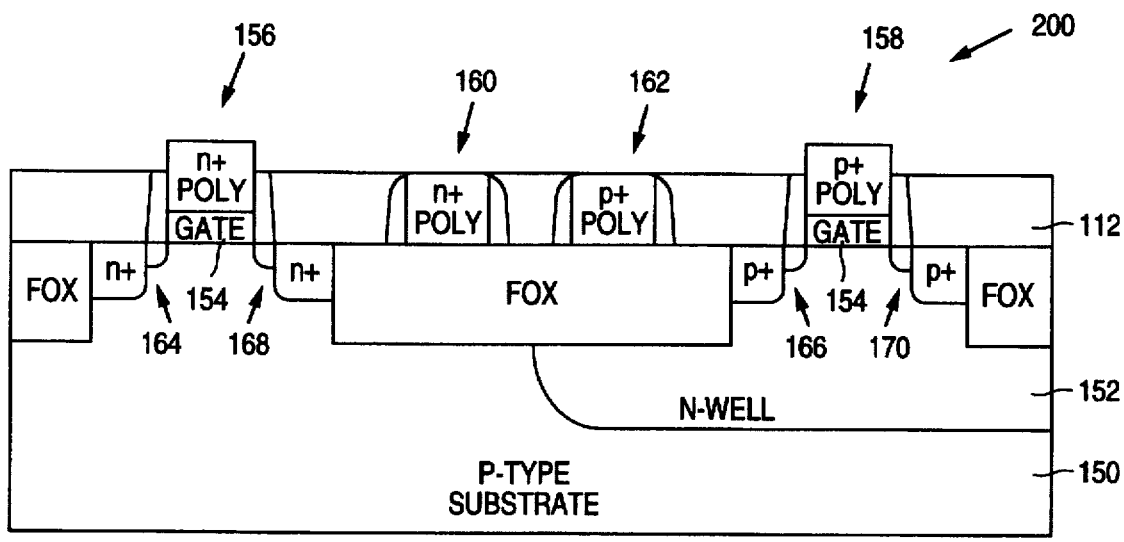
FIG. 7 is a cross-sectional drawing illustrating a first alternative process of the process shown in FIGS. 6A–6E.

In addition to the process described with respect to FIGS. 6A–6E, a number of alternatives may also be practiced within the spirit of the present invention. For example, as shown in FIG. 7, the selective etch can be discontinued after the top surfaces of the interconnect lines 160/162 are exposed.

Figure 8:
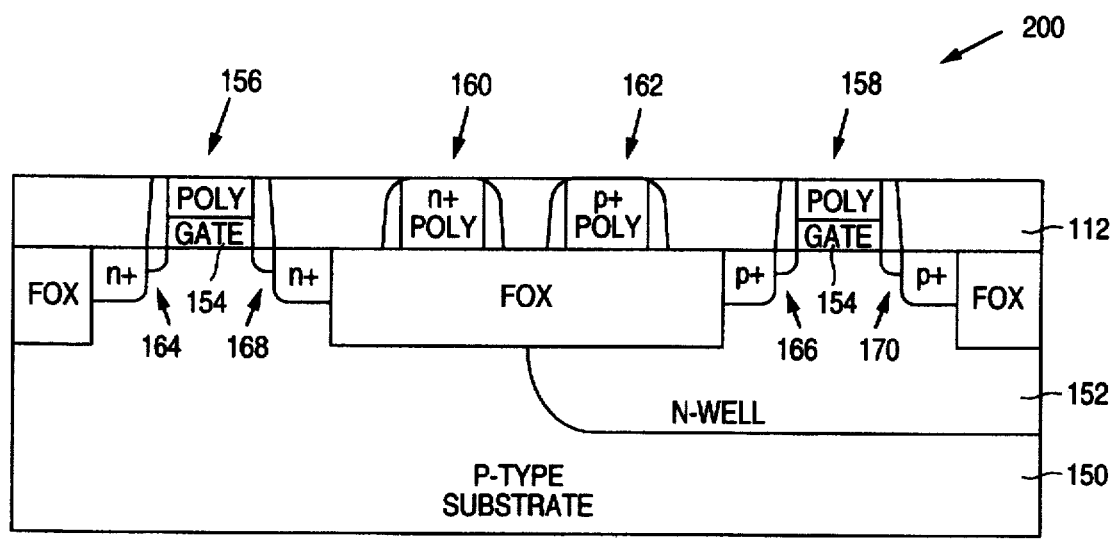
FIG. 8 is a cross-sectional drawing illustrating a second alternative process of the process shown in FIGS. 6A–6E.

In addition, as shown in FIG. 8, the chemical-mechanical polishing of the layer of insulation material 112 can continue until the top surfaces of both the gates 156/158 and interconnect lines 160/162 have been exposed. The process illustrated in FIG. 8 can then alternately be continued by utilizing a selective etch to also expose a portion of the sidewall surfaces of the gates 156/158 and interconnect lines 160/162.

Further, as described above, the removing (CMP planarizing) step can be terminated when the thickness of the layer of insulation material over gates 156/158 and interconnect lines 160/162 is within a predetermined thickness range, and the layer of insulation material 112 is substantially planar. The predetermined thickness range ranges from slightly greater than zero, where a few angstroms of material remain after the chemical-mechanical polishing, to several thousand or tens of thousands of angstroms.

As also described above, rather than depositing the layer of metal 114, a layer of tungsten can be selectively deposited by chemical vapor deposition (CVD). With this CVD process, the layer of tungsten is only formed over the exposed top and sidewall surfaces of the gates 156/158 and interconnect lines 160/162.

The advantage of the CVD process is that the layer of tungsten has a lower sheet resistivity than a layer of tungsten silicide (although the resistivity is higher than a layer of titanium silicide). Thus, the two thermal process steps utilized above to form the layer of silicide can be eliminated.

Thus, a self-aligned polycide process has been described that forms a layer of metal silicide over a polysilicon structure, such as the gates and interconnect lines of a surface-channel CMOS device. The polycide process of the present invention is self aligned in that no masking steps are required to form the layer of silicide over the structures.

Figure 2A:
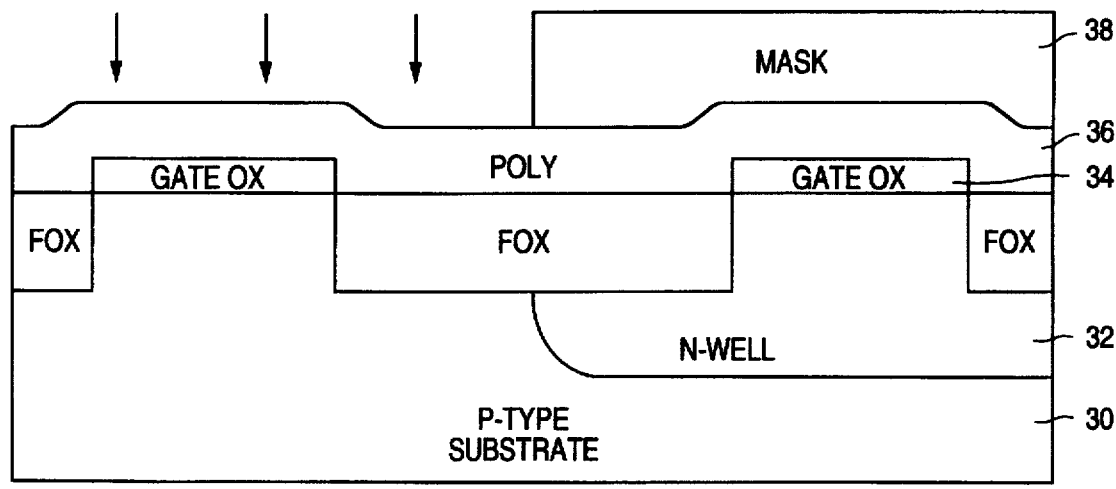
FIGS. 2A–2C are cross-sectional drawings illustrating a polycide process as part of an overall surface-channel CMOS process.
Figure 2B:
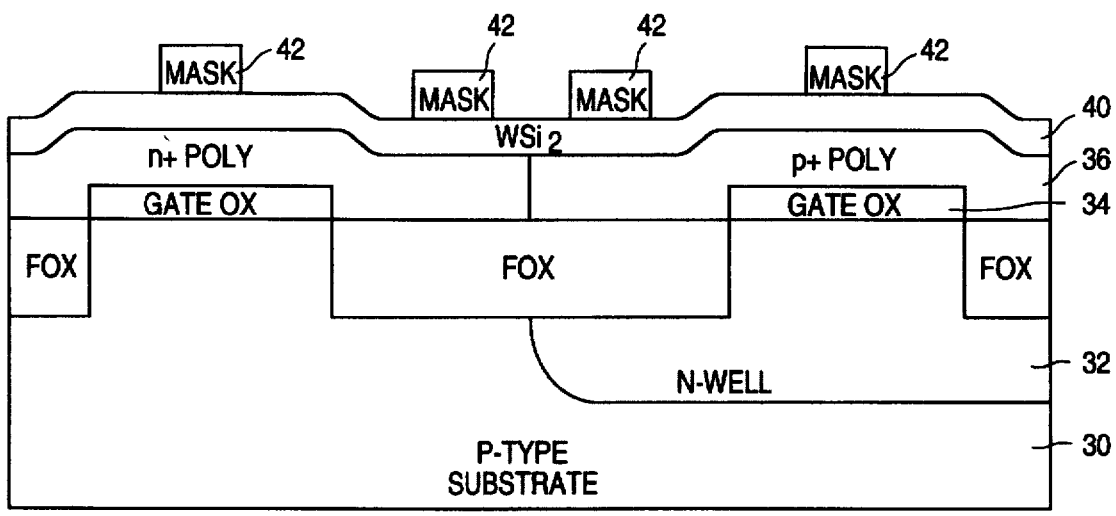
Figure 2C:
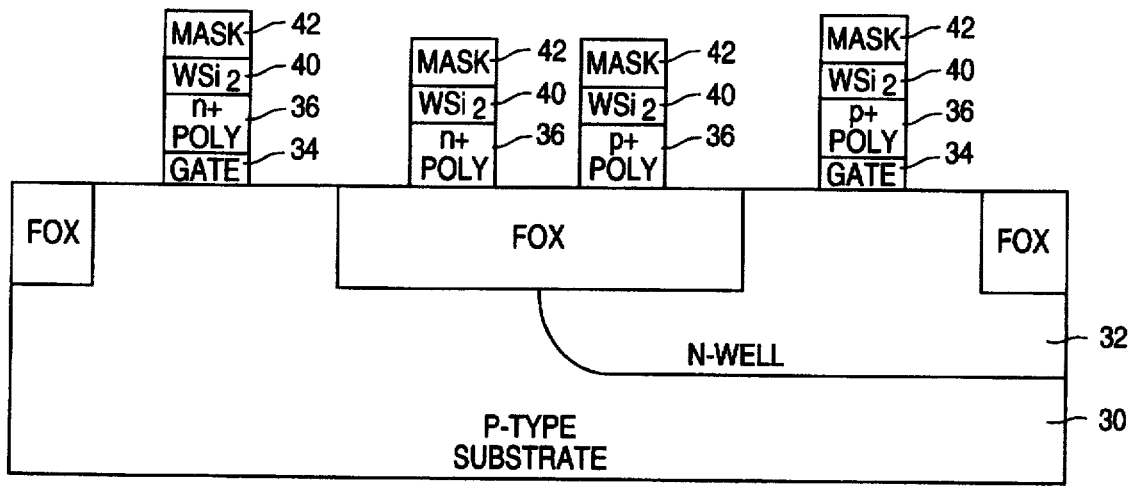
Figure 3A:
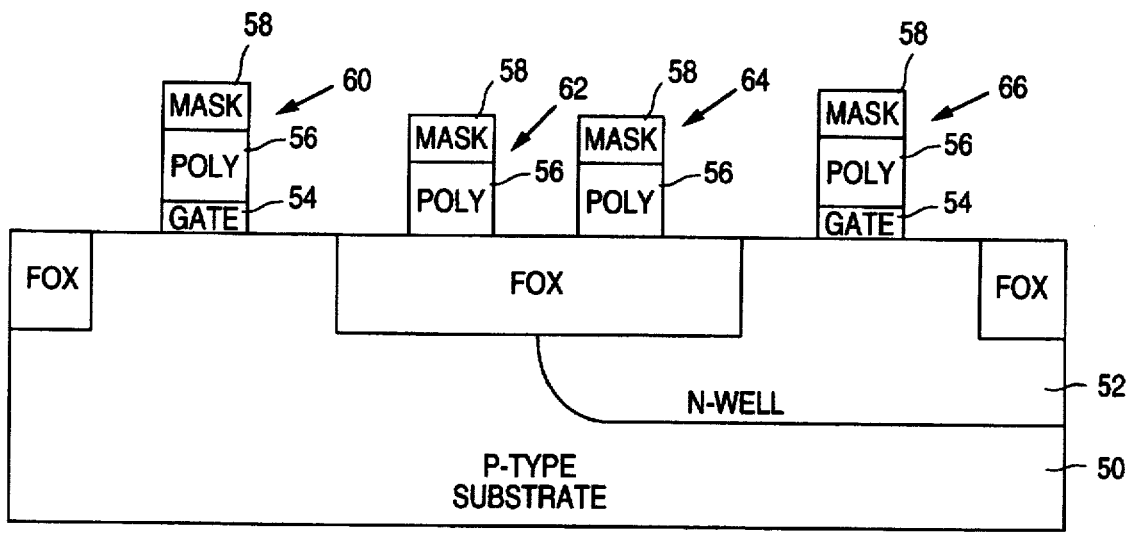
FIGS. 3A–3E are cross-sectional drawings illustrating a conventional salicide process as part of an overall surface-channel CMOS process.
Figure 3B:
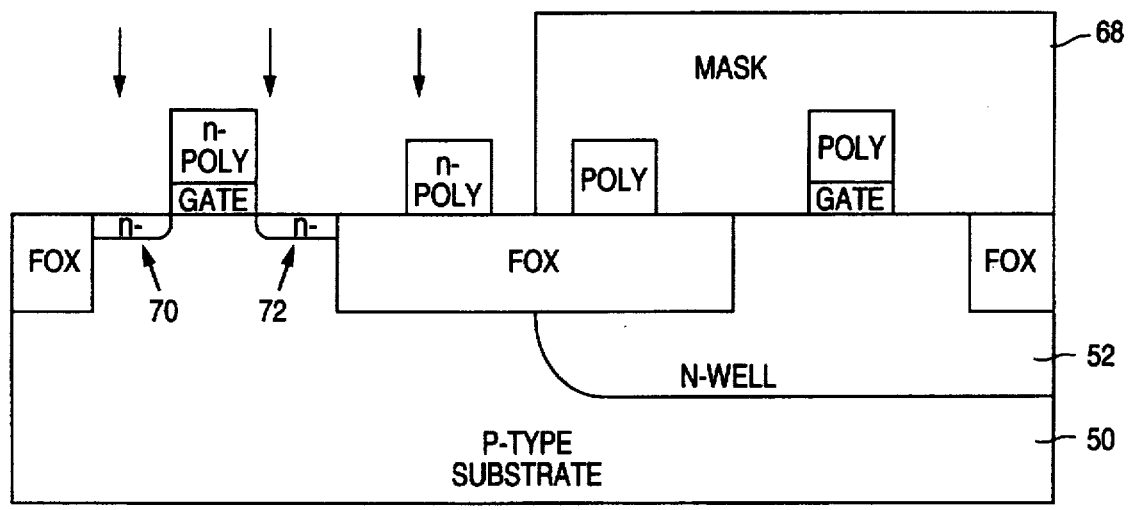
Figure 3C:
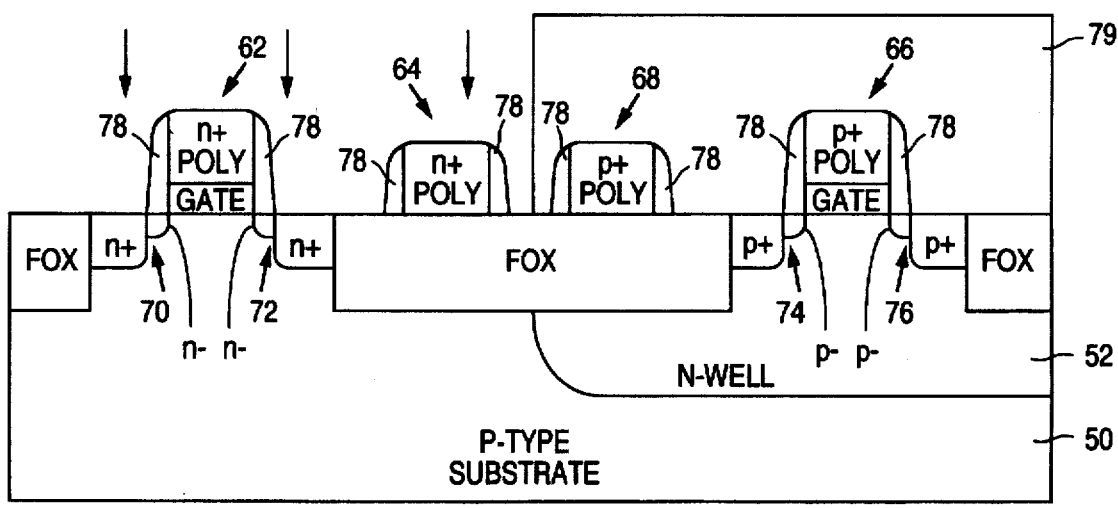
Figure 3D:
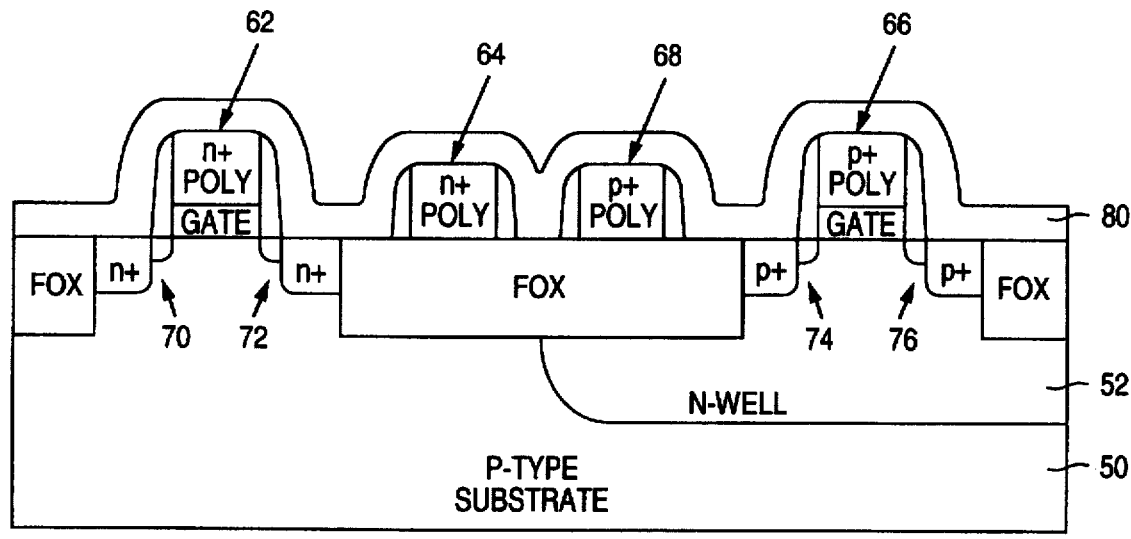
Figure 3E:
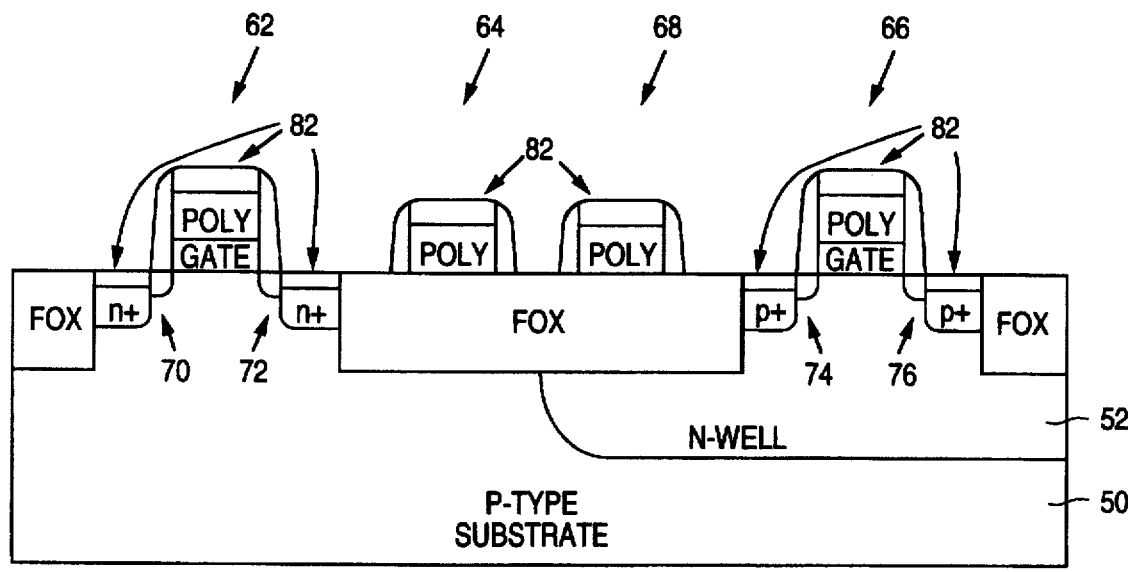

In addition to utilizing two less masking steps than the polycide process described with respect to FIGS. 2A–2C, the layer of metal silicide 116 in the present invention is formed after the high-temperature steps. As a result, the problem of dopant interdiffusion is substantially eliminated. Further, since the layer of metal silicide 116 is formed by reacting the layer of metal 114 with polysilicon, the problem of delamination that occurs with a deposited metal silicide layer is also greatly reduced.

With respect to the conventional salicide CMOS process described in FIGS. 3A–3E, since the source and drain regions are not silicided in the surface-channel process, none of the silicon in the source and drain regions is consumed during the formation of the metal silicide. As a result, the problem of junction leakage that results from silicided source and drain regions is also eliminated (although at the cost of a higher contact resistance). In addition, since the source and drain regions are not silicided, the problem of bridging is also eliminated.

Further, by exposing a portion of the sidewalls of the structures, such as the interconnect lines, as shown in FIGS. 5A and 6C, the problem of increased sheet resistivity that occurs with silicided regions that are less than about 0.25 microns in width is substantially reduced because the silicided surface area is no longer limited to just the top surface.

Figure 1A:
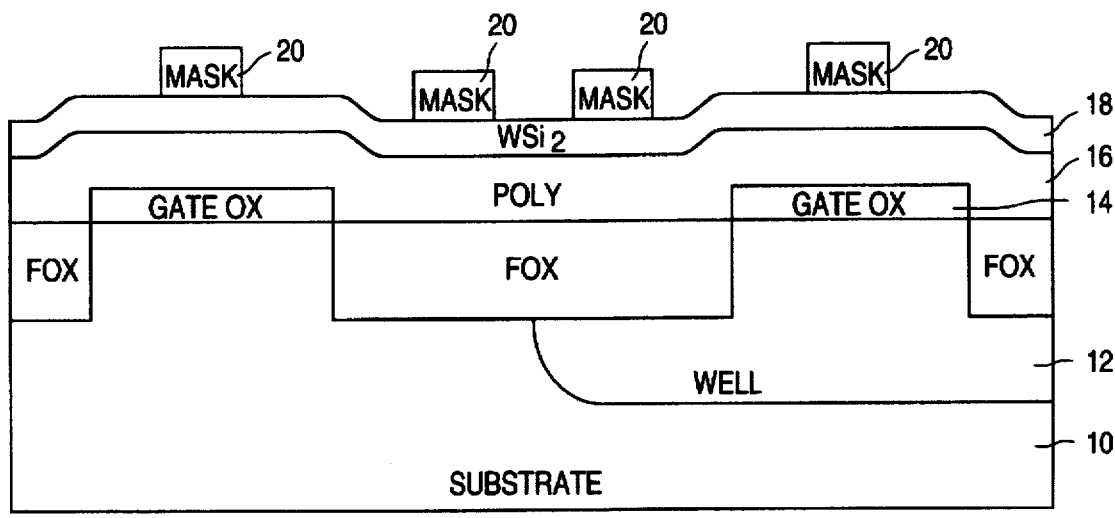
FIGS. 1A–1B are cross-sectional drawings illustrating a standard polycide process as part of an overall buried-channel CMOS process.
Figure 1B:
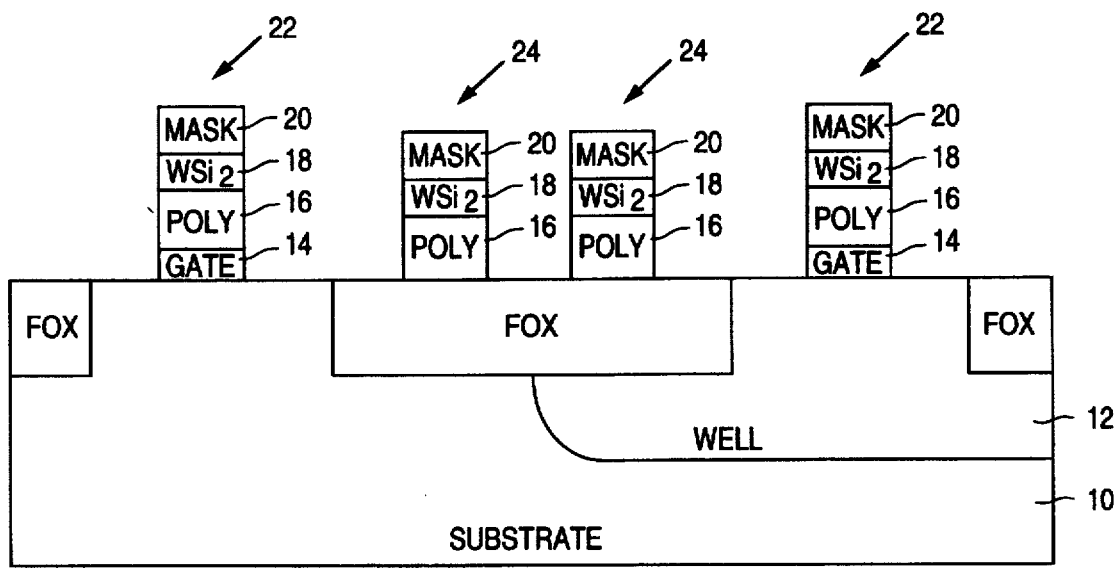
Figure 9:
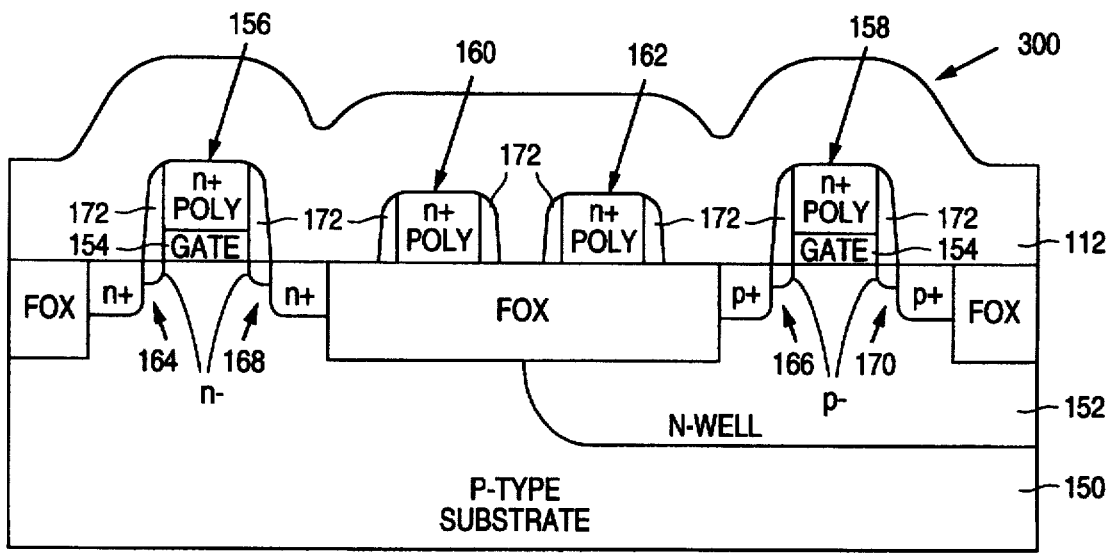
FIG. 9 is a cross-sectional drawing illustrating the self-aligned process of the present invention as applied to a buried-channel CMOS process.

In addition to surface-channel CMOS structures, the present invention can also be used with buried-channel CMOS structures. FIG. 9 shows a buried-channel structure 300 that was conventionally formed except that the tungsten silicide deposition step was omitted (see FIG. 1A). Thus, as shown in FIG. 9, after the spacers and the source/drain regions have been formed, the process of the present invention can begin, as described above, by first depositing the layer of insulation material 112. The process then continues as described above.

In addition, the conventional buried-channel process can be further enhanced in view of the present invention to obtain a simpler manufacturing process. FIGS. 10A–10D show cross-sectional drawings that illustrate the polycide process of the present invention as a part of an enhanced buried-channel CMOS process.

Figure 10A:
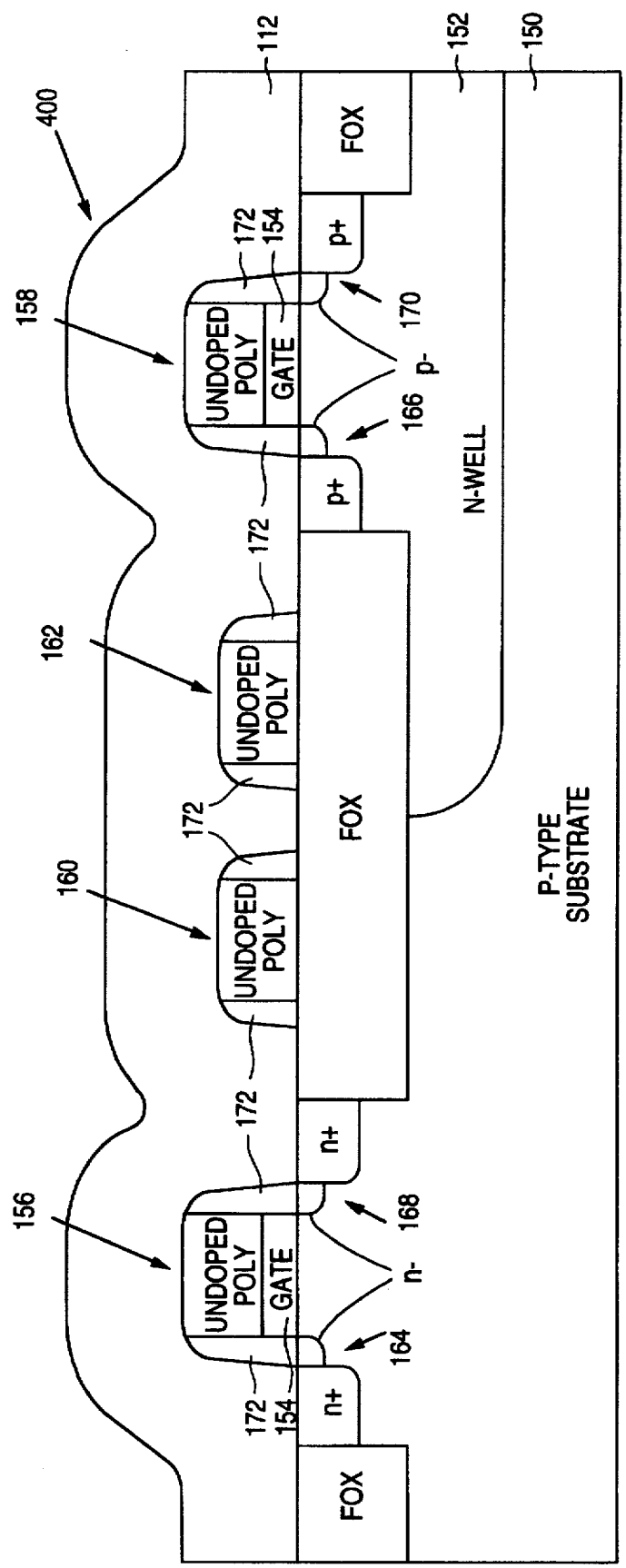
FIGS. 10A–10D are cross-sectional drawings illustrating the self-aligned process of the present invention as applied to an enhanced buried-channel CMOS process.

As shown in FIG. 10A, the enhanced buried-channel process begins with the formation of a buried-channel CMOS structure 400 that includes an n-well region 152 formed in a lightly-doped p-type substrate 150, trenched field oxide regions FOX, a series of gate oxide regions 154, polysilicon gates 156/158, polysilicon interconnect lines 160/162, n+/n− and p+/p− source regions 164/166, n+/n− and p+/p− drain regions 168/170, and oxide spacers 172 (along with channel-stop and threshold implants). CMOS structure 400 differs from a conventionally formed buried-channel device in that the poly layer, such as poly layer 16 (see FIG. 1A), is not doped or covered with an overlying layer of silicide prior to being patterned and etched.

Figure 10B:
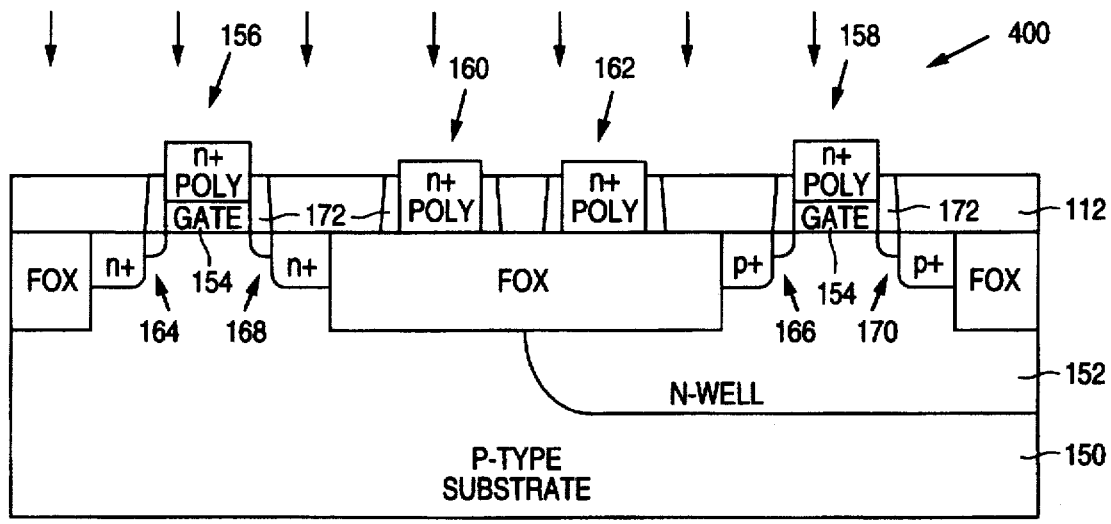
Figure 10C:
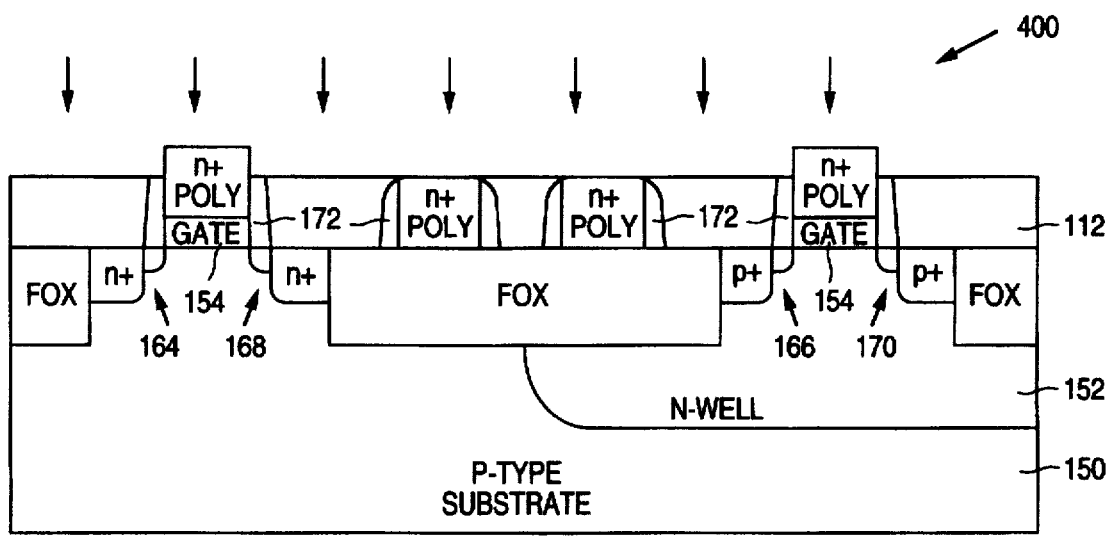
Figure 10D:
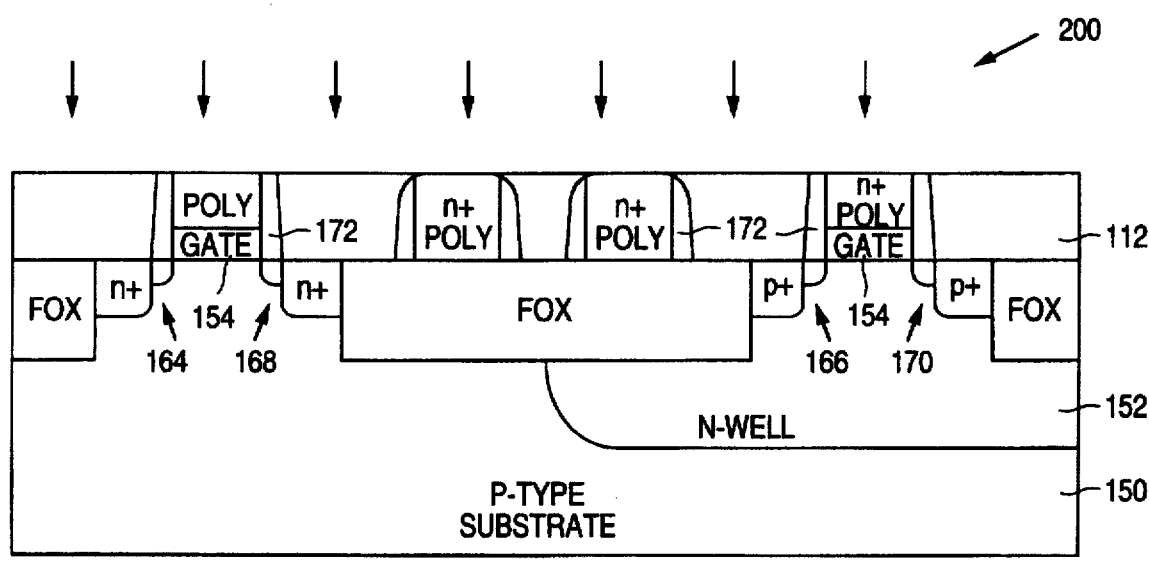

Once CMOS structure 400 has been formed, the buried-channel process of the present invention follows the steps described above, i.e., deposition of the insulation material, planarization of the insulation material, and the optional etchback of the insulation material to expose the sidewalls, to form the structures shown in either FIGS. 10B, 10C, or 10D, depending on the extent of planarizing and etching that is performed.

As shown in FIGS. 10B, 10C, and 10D, the polysilicon gates 156/158 and interconnect lines 160/162 are again exposed at this step. Thus, in accordance with the present invention, the polysilicon gates 156/158 and interconnect lines 160/162 are next doped by implanting the gates 156/158 and interconnect lines 160/162 with an n-type material, such as arsenic, or, alternately, by subjecting the gates 156/158 and interconnect lines 160/162 to a POCl₃ diffusion. Following this, the process continues as described above with the deposition of an overlying layer of metal.

One of the advantages of the above-described buried-channel process is that it is easier to pattern and etch the layer of polysilicon, such as poly layer 16 (see FIG. 1A), when the polysilicon has not been doped due to the lower reflectivity and smaller grain size of the undoped polysilicon. Thus, by doping the polysilicon after the gates have been formed, as described with respect to FIGS. 10A–10D, the fabrication steps required to form the gates are more controllable.

In addition, doped polysilicon oxidizes faster than undoped polysilicon. Thus, less of the polysilicon gates and interconnect lines is oxidized during the processing steps leading up to the formation of the spacers 172. Further, the doping of the gates and interconnect lines also implants an n-type material into portions of the upper regions of the layer of insulation material 112 which, in turn, acts as a gettering site. As a result, the back-end processing step which involves the deposition of a layer of phosphorous-doped oxide to provide a gettering site can be eliminated.

Further, although the present process has been described with respect to trenched field oxide regions FOX, the present invention also applies to field oxide regions which have been formed by the local oxidation of silicon (LOCOS).

Figure 11A:
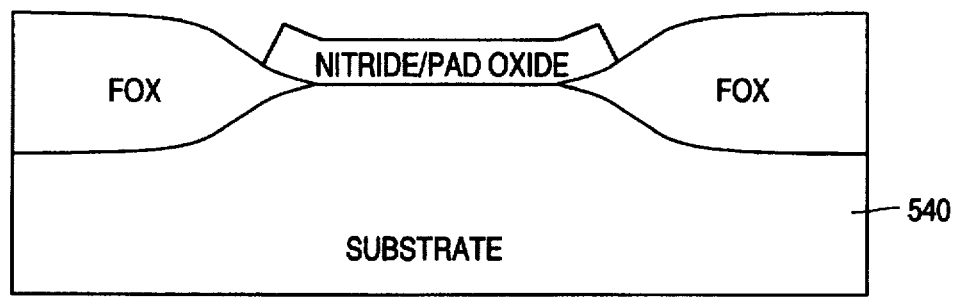
FIGS. 11A–11B are cross-sectional drawings illustrating a first approach to using LOCOS-formed field oxide regions with the process of the present invention.
Figure 11B:
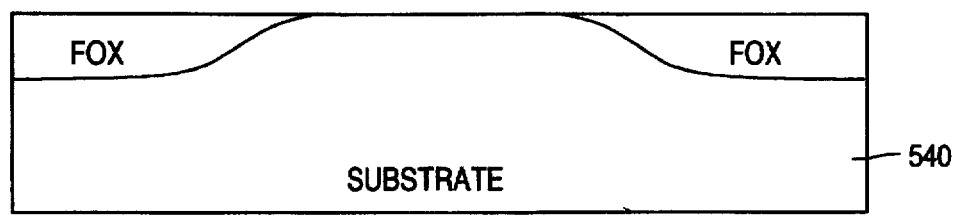

FIGS. 11A–11B show cross-sectional drawings that illustrate a first approach to using LOCOS-formed field oxide regions FOX with the process of the present invention. As shown in FIG. 11A, the conventional LOCOS process produces a field oxide region FOX that extends above the top surface of a substrate 540. Following this, as shown in FIG. 11B, the field oxide regions FOX are planarized using standard CMP or other planarization techniques.

Once the field oxide regions FOX have been planarized, conventional steps are followed to form the underlying structure. Thus, the only significant difference with this approach, as compared to trenched field oxide regions, is the excessive lateral encroachment of the LOCOS-formed field oxide regions.

Figure 12A:
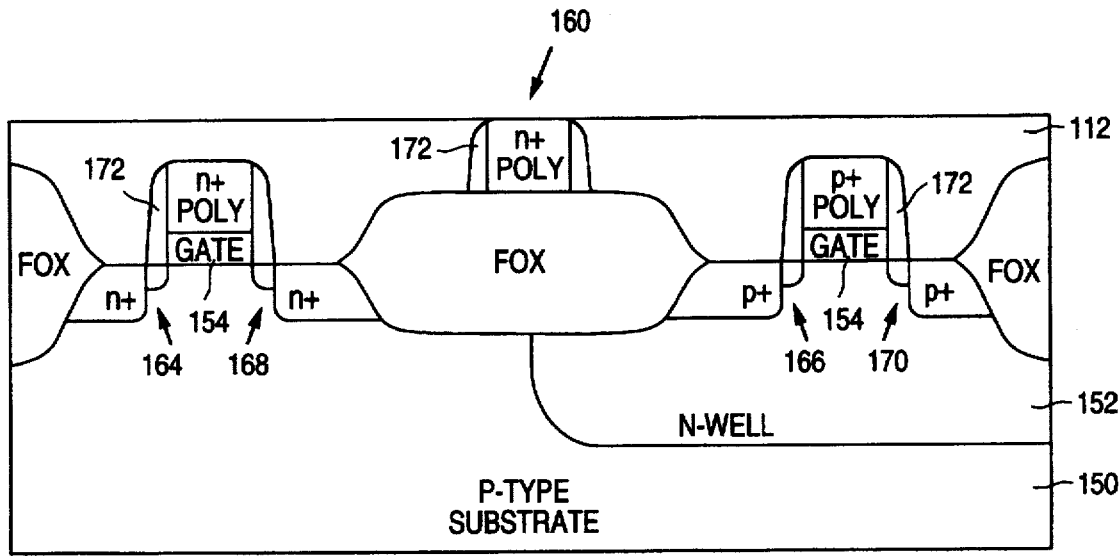
FIGS. 12A–12C are cross-sectional drawings illustrating a second approach to using LOCOS-formed field oxide regions with the process of the present invention.
Figure 12B:
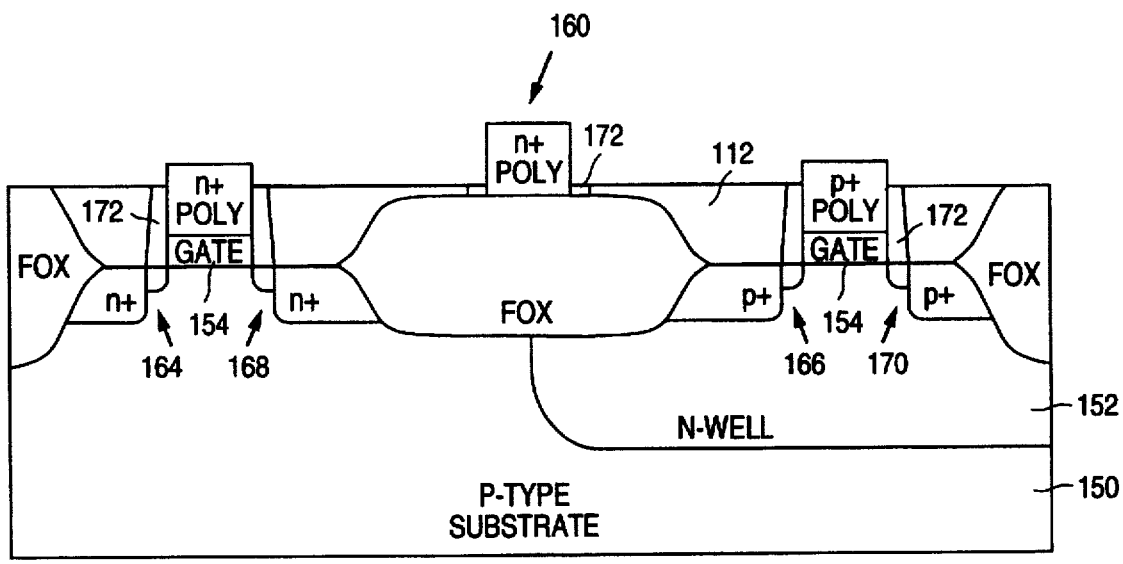
Figure 12C:
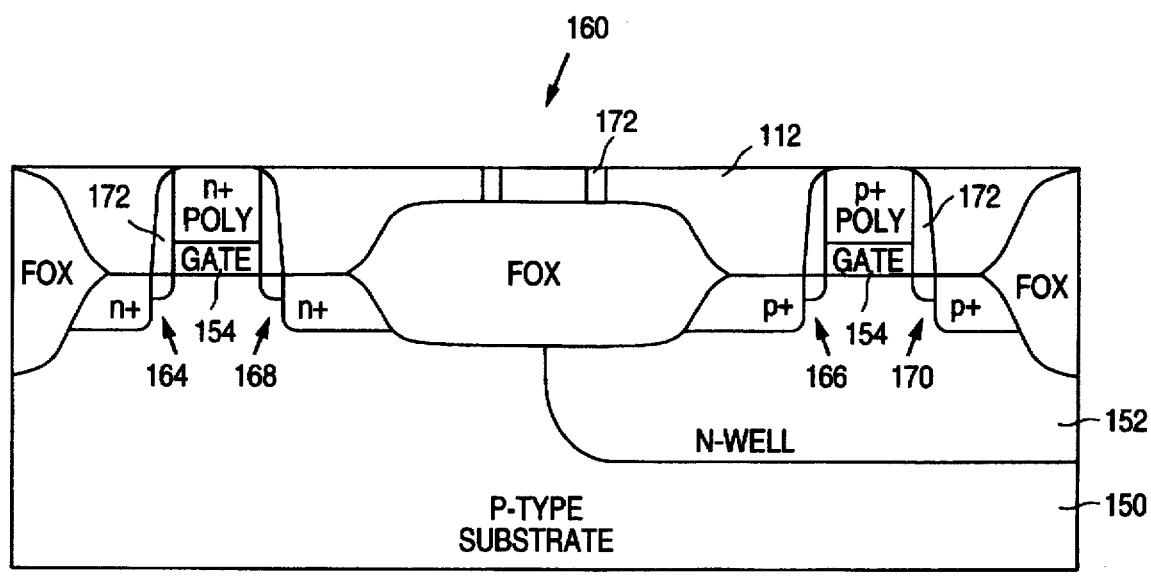

FIGS. 12A–12C show cross-sectional drawings that illustrate a second approach to using LOCOS-formed field oxide regions FOX with the process of the present invention. As shown in FIG. 12A, which corresponds to FIG. 6B, when LOCOS-formed field oxide regions FOX are utilized, the initial planarization step is stopped at the top surface of the interconnect line 160 due to the step height of the field oxide regions FOX.

Thus, as shown in FIG. 12B, which corresponds to FIG. 6C, the selective etch can expose a large portion of the sidewalls of the interconnect line 160 while exposing only a portion of the sidewalls of the gates 156/158.

In an alternate process, rather than forming a layer of metal silicide over both the gates 156/158 and interconnect line 160, the layer of metal silicide can be formed only over the interconnect line 160. The performance of analog transistors is sensitive to the presence of an overlying layer of silicide. As a result, the alternate process allows a layer of silicide to be formed over the interconnect line 160, thereby reducing the sheet resistivity of the lines, without altering the performance of the analog transistors.

Thus, following the planarization step shown in FIG. 12A, or following a slight etch back that also exposes the sides of the interconnect line 160, the layer of metal 114 can be deposited only over the layer of insulation material 112 and the exposed interconnect line 160.

In another alternate approach, as shown in FIG. 12C, the chemical-mechanical polishing of the layer of insulation material 112 can continue until the top surfaces of both the gates 156/158 and interconnect line 160 have been exposed. The process illustrated in FIG. 12C can then alternately be continued by utilizing a selective etch to also expose a portion of the sidewall surfaces of the gates 156/158 and interconnect line 160.

It should be understood that various alternatives to the embodiment of the invention described herein may be employed in practicing the invention. For example, although the present invention has been described with respect to an n-well CMOS process, the present invention applies equally to p-well and twin-well CMOS processes. In addition, the present invention is not limited to surface-channel and buried-channel CMOS processes, but also applies to conventional NMOS and PMOS processes as well as memory cell processes.

Further, although the structures, such as gates 156/158 and interconnect lines 160/162 were described as being formed with polysilicon, amorphous silicon or polycrystalline silicon germanium can also be used. Thus, it is intended that the following claims define the scope of the invention and that methods and structures within the scope of these claims and their equivalents be covered thereby.

What is claimed is:

1. A method for forming a layer of metal silicide over a structure formed as part of a semiconductor device, the method comprising the steps of:

forming a layer of insulation material over the semiconductor device such that the structure is covered with the layer of insulation material;

removing the layer of insulation material until the layer of insulation material is substantially planar, and a surface of the structure is exposed;

depositing a layer of metal over the layer of insulation material and the surface of the structure;

reacting the layer of metal with the structure to form a layer of metal silicide over the structure and a layer of unreacted metal over the layer of insulation material; and removing the layer of unreacted metal from the layer of insulation material.

2. The method of claim 1 wherein the structure includes a gate of a MOS transistor.

3. The method of claim 2 wherein the gate is formed from a material selected from the group consisting of polysilicon, amorphous silicon, and polycrystalline silicon germanium.

4. The method of claim 2 wherein the layer of metal is selected from the group consisting of tungsten, titanium, nickel, and cobalt.

5. The method of claim 2 wherein the layer of insulation material is selected from the group consisting of oxide, nitride, and an oxide/nitride composite.

6. The method of claim 1 wherein the structure includes an emitter of a bipolar transistor.

7. The method of claim 6 wherein the emitter is formed from a material selected from the group consisting of polysilicon, amorphous silicon, and polycrystalline silicon germanium.

8. The method of claim 6 wherein the layer of metal is selected from the group consisting of tungsten, titanium, nickel, and cobalt.

9. The method of claim 6 wherein the layer of insulation material is selected from the group consisting of oxide, nitride, and an oxide/nitride composite.

10. The method of claim 1 wherein the structure includes an interconnect.

11. The method of claim 10 wherein the interconnect is formed from a material selected from the group consisting of polysilicon, amorphous silicon, and polycrystalline silicon germanium.

12. The method of claim 10 wherein the layer of metal is selected from the group consisting of tungsten, titanium, nickel, and cobalt.

13. The method of claim 10 wherein the layer of insulation material is selected from the group consisting of oxide, nitride, and an oxide/nitride composite.

14. The method of claim 1 and further comprising the step of:

etching the planarized layer of insulation material until sidewall portions of the structure are exposed.

15. A method for forming a layer of metal silicide over a structure formed as part of a semiconductor device, the method comprising the steps of:

forming a layer of insulation material over the semiconductor device so that the structure is covered with the layer of insulation material;

removing the layer of insulation material until the layer of insulation material is substantially planar, and the thickness of the layer of insulation material over the structure is within a thickness range;

etching the planarized layer of insulation material until portions of the structure are exposed;

depositing a layer of metal over the layer of insulation material and the exposed structure;

reacting the layer of metal with the structure to form a layer of metal silicide over the structure and a layer of unreacted metal over the layer of insulation material; and removing the layer of unreacted metal from the layer of insulation material.

16. The method of claim 15 wherein the structure includes a gate of a MOS transistor.

17. The method of claim 16 wherein the gate is formed from a material selected from the group consisting of polysilicon, amorphous silicon, and polycrystalline silicon germanium.

18. The method of claim 16 wherein the layer of metal is selected from the group consisting of tungsten, titanium, nickel, and cobalt.

19. The method of claim 16 wherein the layer of insulation material is selected from the group consisting of oxide, nitride, and an oxide/nitride composite.

20. The method of claim 15 wherein the structure includes an emitter of a bipolar transistor.

21. The method of claim 20 wherein the emitter is formed from a material selected from the group consisting of polysilicon, amorphous silicon, and polycrystalline silicon germanium.

22. The method of claim 20 wherein the layer of metal is selected from the group consisting of tungsten, titanium, nickel, and cobalt.

23. The method of claim 20 wherein the layer of insulation material is selected from the group consisting of oxide, nitride, and an oxide/nitride composite.

24. The method of claim 15 wherein the structure includes an interconnect.

25. The method of claim 24 wherein the interconnect line is formed from a material selected from the group consisting of polysilicon, amorphous silicon, and polycrystalline silicon germanium.

26. The method of claim 24 wherein the layer of metal is selected from the group consisting of tungsten, titanium, nickel, and cobalt.

27. The method of claim 24 wherein the layer of insulation material is selected from the group consisting of oxide, nitride, and an oxide/nitride composite.

28. A method for forming a layer of metal silicide over a structure formed as part of a semiconductor device, the method comprising the steps of:

forming a layer of insulation material over the semiconductor device such that the structure is covered with the layer of insulation material;

removing the layer of insulation material until the layer of insulation material is substantially planar, and a surface of the structure is exposed; and selectively chemical vapor depositing a layer of metal over the structure.

29. The method of claim 28 wherein the structure includes a gate of a MOS transistor.

30. The method of claim 29 wherein the gate is formed from a material selected from the group consisting of polysilicon, amorphous silicon, and polycrystalline silicon germanium.

31. The method of claim 29 wherein the layer of metal is selected from the group consisting of tungsten, titanium, nickel, and cobalt.

32. The method of claim 29 wherein the layer of insulation material is selected from the group consisting of oxide, nitride, and an oxide/nitride composite.

33. The method of claim 28 wherein the structure includes an emitter of a bipolar transistor.

34. The method of claim 33 wherein the emitter is formed from a material selected from the group consisting of polysilicon, amorphous silicon, and polycrystalline silicon germanium.

35. The method of claim 33 wherein the layer of metal is selected from the group consisting of tungsten, titanium, nickel, and cobalt.

36. The method of claim 33 wherein the layer of insulation material is selected from the group consisting of oxide, nitride, and an oxide/nitride composite.

37. The method of claim 28 wherein the structure includes an interconnect.

38. The method of claim 37 wherein the interconnect is formed from a material selected from the group consisting of polysilicon, amorphous silicon, and polycrystalline silicon germanium.

39. The method of claim 37 wherein the layer of metal is selected from the group consisting of tungsten, titanium, nickel, and cobalt.

40. The method of claim 37 wherein the layer of insulation material is selected from the group consisting of oxide, nitride, and an oxide/nitride composite.

41. A method for forming polycide on a semiconductor device formed in a substrate of a first conductivity type, the device including:
    a plurality of active device regions;
    a field oxide region formed in the substrate that isolates the plurality of active device regions,
    a plurality of spaced-apart doped regions formed in the substrate so that a pair of doped regions is formed in each active device region, the doped regions defining a plurality of substrate channel regions such that each pair of doped regions in an active device region defines a corresponding substrate channel region therebetween,
    a plurality of gate oxide regions formed over the plurality of substrate channel regions such that each gate oxide region is formed over a corresponding substrate channel region,
    a plurality of gates formed over the plurality of gate oxide regions such that each gate is formed over a corresponding gate oxide region, each of the gates having sidewalls,
    an interconnect line formed over the field oxide region, the interconnect line having sidewalls, and
    a plurality of spacers formed over the sidewalls of the gates, and the sidewalls of the interconnect line,
    the method comprising the steps of:
    depositing a layer of insulation material having a thickness over the field oxide region, the substrate, the gates, the interconnect line, and the spacers;
    removing the layer of insulation material until the layer of insulation material is substantially planar, and a surface of the gates is exposed;
    etching the layer of insulation material until surfaces of both the gates and the interconnect line are exposed;
    depositing a layer of metal over the layer of insulation material, the gates, the spacers, and the interconnect line;
    reacting the layer of metal with the gates and interconnect line to form a layer of metal silicide over the gates and interconnect line, and a layer of unreacted metal over the layer of insulation material and the spacers; and
    removing the layer of unreacted metal from the layer of insulation material and the spacers, thereby leaving the layer of metal silicide over the gates and the interconnect line.

42. The method of claim 41 wherein a first number of the gates are doped to have the first conductivity type, and a second number of the gates are doped to have a second conductivity type.

43. The method of claim 42 wherein the gates are formed from a material selected from the group consisting of polysilicon, amorphous silicon, and polycrystalline silicon germanium.

44. The method of claim 42 wherein the layer of metal is selected from the group consisting of tungsten, titanium, nickel, and cobalt.

45. The method of claim 42 wherein the layer of insulation material is selected from the group consisting of oxide, nitride, and an oxide/nitride composite.

46. The method of claim 42 wherein the field oxide region includes a trenched field oxide region.

47. The method of claim 42 wherein the etching step exposes a portion of the sidewalls of the interconnect line.

48. The method of claim 41 wherein the gates have a single conductivity type.

49. The method of claim 48 wherein the gates are formed from a material selected from the group consisting of polysilicon, amorphous silicon, and polycrystalline silicon germanium.

50. The method of claim 48 wherein the layer of metal is selected from the group consisting of tungsten, titanium, nickel, and cobalt.

51. The method of claim 48 wherein the layer of insulation material is selected from the group consisting of oxide, nitride, and an oxide/nitride composite.

52. The method of claim 48 wherein the field oxide region includes a trenched field oxide region.

53. The method of claim 48 wherein the etching step exposes a portion of the sidewalls of the interconnect line.

54. The method of claim 48 and further comprising the step of doping the gates and the interconnect line prior to the step of depositing the layer of metal.

55. A method for forming polycide on a semiconductor device formed in a substrate of a first conductivity type, the device including:
    a plurality of active device regions;
    a field oxide region formed in the substrate that isolates the plurality of active device regions,
    a plurality of spaced-apart doped regions formed in the substrate so that a pair of doped regions is formed in each active device region, the doped regions defining a plurality of substrate channel regions such that each pair of doped regions in an active device region defines a corresponding substrate channel region therebetween,
    a plurality of gate oxide regions formed over the plurality of substrate channel regions such that each gate oxide region is formed over a corresponding substrate channel region,
    a plurality of gates formed over the plurality of gate oxide regions such that each gate is formed over a corresponding gate oxide region,
    an interconnect line formed over the field oxide region, the interconnect line having sidewalls, and
    a plurality of spacers formed over the sidewalls of the gates, and the sidewalls of the interconnect line,
    the method comprising the steps of:
    depositing a layer of insulation material having a thickness over the field oxide region, the substrate, the gates, the interconnect line, and the spacers;
    removing the layer of insulation material, a portion of the gates, and a portion of the spacers formed over the sidewalls of the gates until the layer of insulation material is substantially planar, and the top surfaces of the gates and the interconnect line are exposed;
    depositing a layer of metal over the layer of insulation material, the spacers, the gates, and the interconnect line;
    reacting the layer of metal with the gates and the interconnect line to form a layer of metal silicide over the gates and interconnect line, and a layer of unreacted metal over the layer of insulation material and the spacers; and removing the layer of unreacted metal, thereby leaving the layer of metal silicide over the gates and the interconnect line.

56. The method of claim 55 and further including the step of etching the layer of insulation material and the spacers to expose the sidewalls of the gates and the interconnect line.

57. A method for forming polycide on a semiconductor device formed in a substrate of a first conductivity type, the device including:

a plurality of active device regions;

a field oxide region formed in the substrate that isolates the plurality of active device regions, a plurality of spaced-apart doped regions formed in the substrate so that a pair of doped regions is formed in each active device region, the doped regions defining a plurality of substrate channel regions such that each pair of doped regions in an active device region defines a corresponding substrate channel region therebetween, a plurality of gate oxide regions formed over the plurality of substrate channel regions such that each gate oxide region is formed over a corresponding substrate channel region, a plurality of gates formed over the plurality of gate oxide regions such that each gate is formed over a corresponding gate oxide region, each of the gates having sidewalls, an interconnect line formed over the field oxide region, the interconnect line having sidewalls, and a plurality of spacers formed over the sidewalls of the gates, and the sidewalls of the interconnect line, the method comprising the steps of:

depositing a layer of insulation material having a thickness over the field oxide region, the substrate, the gates, the interconnect line, and the spacers;

removing the layer of insulation material until the layer of insulation material is substantially planar, and the thickness of the layer of insulation material over the gates is within a thickness range;

etching the layer of insulation material until surfaces of both the gates and the interconnect line are exposed;

depositing a layer of metal over the layer of insulation material, the gates, the spacers, and the interconnect line;

reacting the layer of metal with the gates and interconnect line to form a layer of metal silicide over the gates and interconnect line, and a layer of unreacted metal over the layer of insulation material and the spacers; and removing the layer of unreacted metal, thereby leaving the layer of metal silicide over the gates and the interconnect line.

58. The method of claim 57 wherein a first number of the gates are doped to have the first conductivity type, and a second number of the gates are doped to have a second conductivity type.

59. The method of claim 58 wherein the gates are formed from a material selected from the group consisting of polysilicon, amorphous silicon, and polycrystalline silicon germanium.

60. The method of claim 58 wherein the layer of metal is selected from the group consisting of tungsten, titanium, nickel, and cobalt.

61. The method of claim 58 wherein the layer of insulation material is selected from the group consisting of oxide, nitride, and an oxide/nitride composite.

62. The method of claim 58 wherein the field oxide region includes a trenched field oxide region.

63. The method of claim 58 wherein the etching step exposes a portion of the sidewalls of the interconnect line.

64. The method of claim 58 wherein the gates have a single conductivity type.

65. The method of claim 64 wherein the gates are formed from a material selected from the group consisting of polysilicon, amorphous silicon, and polycrystalline silicon germanium.

66. The method of claim 64 wherein the layer of metal is selected from the group consisting of tungsten, titanium, nickel, and cobalt.

67. The method of claim 64 wherein the layer of insulation material is selected from the group consisting of oxide, nitride, and an oxide/nitride composite.

68. The method of claim 64 wherein the field oxide region includes a trenched field oxide region.

69. The method of claim 64 wherein the etching step exposes a portion of the sidewalls of the interconnect line.

70. The method of claim 64 and further comprising the step of doping the gates and the interconnect line prior to the step of depositing the layer of metal.

71. A method for forming polycide on a semiconductor device formed in a substrate of a first conductivity type, the device including:

spaced-apart doped regions formed in the substrate, the doped regions defining a substrate channel region therebetween, a gate oxide region formed over the substrate channel region, a gate formed over the gate oxide region, the gate having sidewalls, and a spacer formed over the sidewalls of the gate, the method comprising the steps of:

depositing a layer of insulation material having a thickness over the substrate, the gate, and the spacer;

removing the layer of insulation material until the layer of insulation material is substantially planar, and the thickness of the layer of insulation material over the gate is within a thickness range;

etching the layer of insulation material until a surface of the gate is exposed;

depositing a layer of metal over the layer of insulation material and the gate;

reacting the layer of metal with the gate to form a layer of metal silicide over the gate, and a layer of unreacted metal over the layer of insulation material; and removing the layer of unreacted metal from the layer of insulation material, thereby leaving the layer of metal silicide over the gate.

\* \* \* \* \*